(12) United States Patent
Lin et al.

(10) Patent No.: US 6,400,551 B1
(45) Date of Patent: Jun. 4, 2002

(54) STRUCTURE OF A CAPACITOR

(76) Inventors: Ming Chang Lin; Su-Chin Lai, both of PO Box 82-144, Taipei (TW)

( * ) Notice: Subject to any disclaimer, the term of this patent is extended or adjusted under 35 U.S.C. 154(b) by 0 days.

(21) Appl. No.: 09/851,574

(22) Filed: May 10, 2001

(51) Int. Cl.[7] .......................... H01G 4/00; H01G 4/236
(52) U.S. Cl. ................ 361/301.3; 361/306.1; 361/307; 361/308.1; 361/309
(58) Field of Search ............... 361/301.3, 303, 361/306.1, 307, 308.1, 309, 310

(56) References Cited

U.S. PATENT DOCUMENTS

| | | | | |
|---|---|---|---|---|
| 5,548,473 A | * | 8/1996 | Wang | 361/301.1 |
| 5,846,098 A | * | 12/1998 | Shiga et al. | 439/409 |
| 6,118,646 A | * | 9/2000 | Yang et al. | 361/301.3 |
| 6,233,133 B1 | * | 5/2001 | Weng | 361/301.3 |

* cited by examiner

*Primary Examiner*—Anthony Dinkins
(74) *Attorney, Agent, or Firm*—A & J

(57) ABSTRACT

An improved structure of a capacitor having a housing comprising two copper plates mounted at two lateral sides of the housing having a capacitor element in between, and a securing rubber filled within the remaining space of the housing, characterized in that a plurality of downwardly slanting elastic plates mounted at the corresponding plate of the two copper plates for the engagement with the capacitor element, the lower section of the copper plates is inwardly bent to connect with a 90 degree connection pins, the top of the connection pins are provided with solder for soldering onto a circuit board, the connection pins are punched to form a fine insertion pin for optionally mounting onto any circuit board, thereby the elastic plates clip the capacitor element to provide and/or to secure a stable soldering and contact.

5 Claims, 5 Drawing Sheets

STRUCTURE OF A CAPACITOR

BACKGROUND OF THE INVENTION (a) Field of the Invention

The present invention relates to a capacitor, and in particular, to an improved structure of a capacitor, which allows working efficiency in soldering process and reduces space in the course of soldering on IC boards.

(b) Description of the Prior Art

FIGS. 1 and 2 show a conventional low power capacitor having a smaller capacity and being mounted onto the circuit board 1 of electrical appliances. The capacitor comprises a housing 2, two connection pins 3, a capacitor element 4 and securing rubber 5.

The housing 2 is a rectangular plastic housing body having an opening at one side, and the inner wall of the two sides of the housing 2 being circular arch-shaped protruded plate 20 having two opened ends such that a conductive slot 21 is formed for the mounting of the connection pins 3.

The connection pin 3 has an upper section soldered at the two lateral sides of the capacitor element 4, and the connection pin 3 is bent at an appropriate position to form an engaging section 30 for mounting at the conductive slot 21 so as to position the capacitor element 4 at the center of the housing 2, and to allow the securing rubber 5 to fully enclose the external of the capacitor element 4 so as to avoid explosion as a result of high voltage and to prevent oxidation of the capacitor element 4 with the air.

The capacitor element 4 is mounted within the interior of the housing 2 and has a plurality of oval shape metal-coated layers and films stacked to form an oval-shaped structure. The two lateral sides are soldered with the connection pins 3.

The securing rubber 5 fills up all the space within the housing 2 other than the capacitor element 4 and the connection pins 3 so as to enclose the capacitor element 4 to avoid the explosion of the capacitor element 4 due to excessive voltage or the avoid oxidation as a result of prolong air contact of the capacitor element 4 with air.

Referring to FIG. 1, the upper section of the two connection pins 3 are soldered to the two lateral sides of the capacitor element 4, and the capacitor element 4 is then inserted to the housing 2. The protruded section 30 of the two connection pins 3 slide into the conductive slots 21 at the two lateral sides of the housing 2 so that the capacitor element 4 is fixed at the center of the interior of the housing 2. After that, the housing 2 is filled up with the securing rubber 5 to enclose the capacitor element 4.

Referring to FIG. 2, there is shown the soldering of the capacitor onto the circuit board 1. The two connection pins 3 of the capacitor have to be trimmed to a width similar to that of the soldering hole 10 of the circuit board, and then are inserted therein. A solder 11 is used to solder the circuit board. After that, the protruded length of the connection pins are cut or trimmed. Thus, the capacitor is fully mounted onto the circuit board.

The disadvantages of the conventional capacitors are as follows:

(1) The manufacturing process is complicated and the defect products are high.
(2) The soldering process may damage the circuit board.
(3) The process of installation onto the circuit board is complicated.
(4) The installation of the capacitor takes up space.
(5) The formation of soldering holes is difficult.

Another conventional high power capacitor is disclosed in Taiwan Publication no. 98458 comprising a cover 1, a capacitor element 2, two conductive spring plates 3, a fixing plate 4 and a housing body 5. The capacitor element 2 is mounted to the housing body 2 by means of a plurality of elastic plates 3 of the conductive spring plate 3. There is not soldering between the conductive plates 3 and the capacitor element 2. Due to the fact that no fixing glue is used and therefore the mounting of the capacitor element 2 is poor.

SUMMARY OF THE INVENTION

Accordingly, it is an object of the present invention to provide an improved structure of a capacitor having a housing comprising two copper plates mounted at two lateral sides of the housing having a capacitor element in between, and a securing rubber filled within the remaining space of the housing, characterized in that a plurality of downwardly slanting elastic plates mounted at the corresponding plate of the two copper plates for the engagement with the capacitor element, the lower section of the copper plates is inwardly bent to connect with a 90 degree connection pins, the top of the connection pins are provided with solder for soldering onto a circuit board, the connection pins are punched to form a fine insertion pin for optionally mounting onto any circuit board, thereby the elastic plates clip the capacitor element to provide stable and secure soldering and contact.

Yet another object of the present invention is to provide an improved structure of a capacitor, wherein the legs of the capacitor do not need to be trimmed or cut to improve working efficiency and in turn the external appearance of the capacitor will not be damaged.

A further object of the present invention is to provide an improved structure of a capacitor, wherein the height of the capacitor in the course of mounting on to an IC board is reduced and thus the capacitor will not occupy a large space.

Other object and advantages of the present invention will become more apparent from the following description taken in conjunction with the accompanying drawing.

DETAILED DESCRIPTION OF THE PRESENT INVENTION

Figure 1:
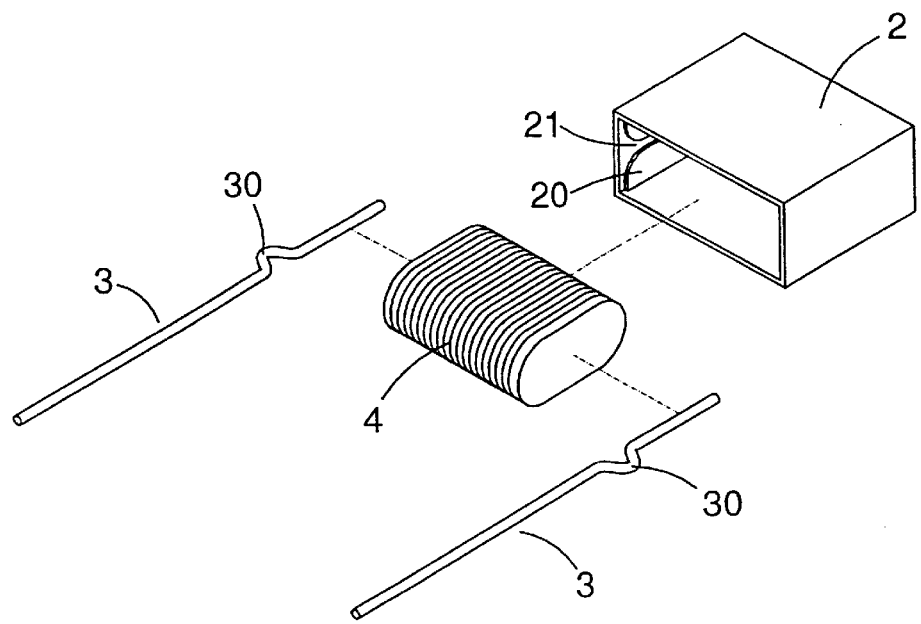
FIG. 1 is a perspective exploded view of a conventional capacitor.
Figure 2:
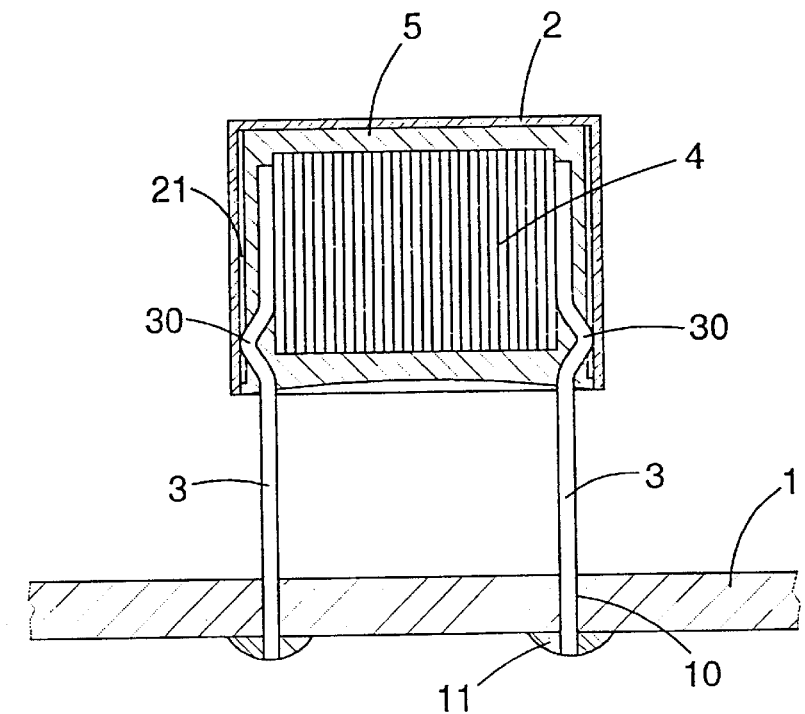
FIG. 2 is a sectional view of the conventional capacitor.
Figure 3:
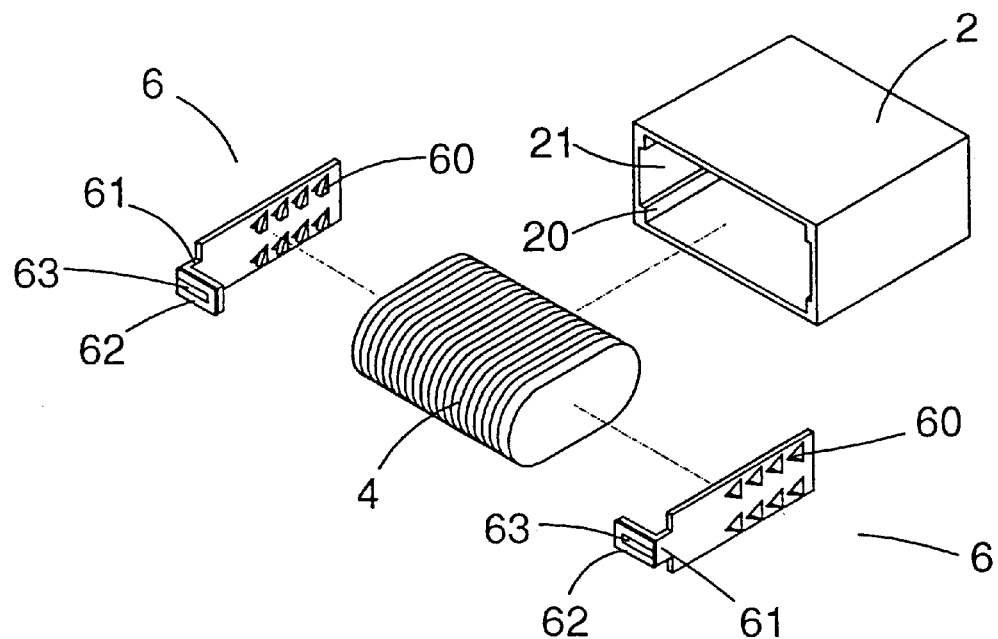
FIG. 3 is a perspective exploded view of an improved structure of a capacitor of the present invention.
Figure 4:
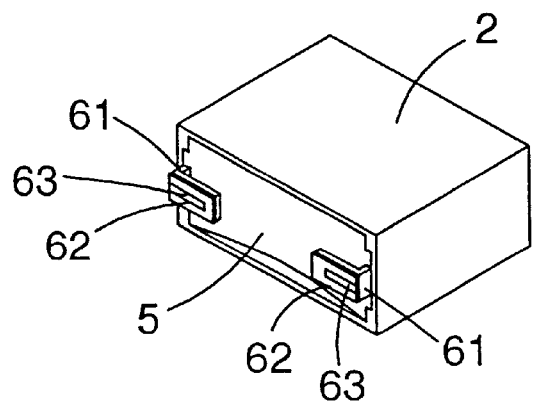
FIG. 4 is a perspective view of the capacitor in accordance with the present invention.
Figure 5:
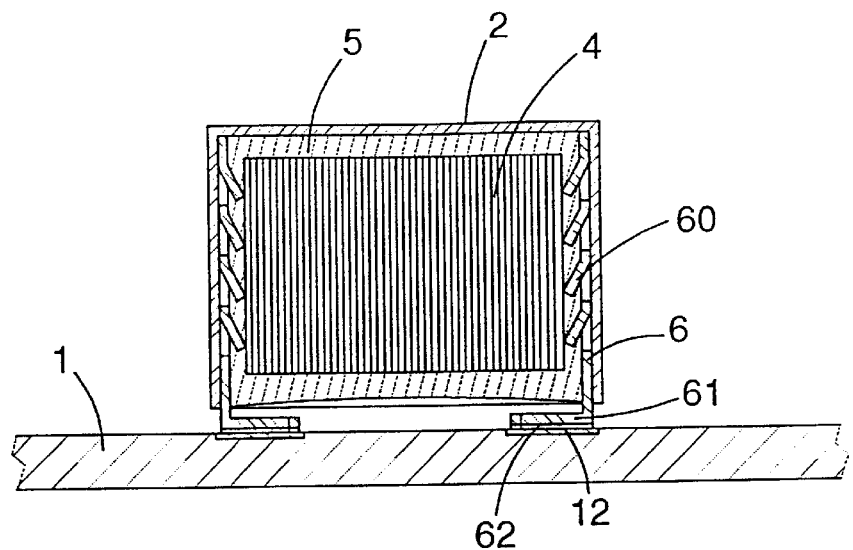
FIG. 5 is a sectional view showing the mounting of the capacitor of the present invention onto a circuit board.

Refining to FIGS. 3 to 5, there is shown an improved structure of a capacitor comprising a housing 2, two copper plates 6, a capacitor element 4 and a securing rubber 5.

The housing 2 is substantially a rectangular insulative plastic housing body having an opening at one lateral side thereof, and the inner wall of the two lateral sides of the housing 2 being provided with two protruded plates 20, forming a conductive slot 21 for the engagement of the copper plates 6.

The two copper plates 6 are correspondingly on a flat surface and are punched from the exterior to the interior to protrudingly form a slanting elastic plate 60 with appropriate angle allowing the engagement with the two lateral sides of the capacitor element 4, and mounted at the center of the housing 2. The lower section of the copper plates 6 is a 90° C. bent connection pins 61 and the bottom face of the connection pins 6 is provided with a layer of solder 62 such that the connection pins 61 are directly soldered onto the circuit 12 of the circuit board 1. The connection pins 61 are punched into a fine insertion pin 63 for mounting onto a conventional circuit board 1.

The capacitor element 4 is mounted within the interior of the housing 2 and has a plurality of oval shaped metal-coated layers and dielectric films stacked to form an oval-shaped cylindrical body.

The securing rubber 5 is filled all over the space within the housing 2 other than the capacitor element 4 and the connection pins 61 so as to enclose the capacitor element 4 to avoid explosion of the capacitor element 4 as a result of excessive voltage or to avoid oxidation as a result of prolong air contact of the capacitor element 4 with air.

Referring to FIG. 3, in the course of installation of the capacitor, the two copper plates 6 are pressed against the two lateral sides of the capacitor elements 4 such that the elastic plate 60 of the two copper plates 6 deforms and urges against the two lateral sides of the capacitor element 4. After that, the capacitor element 4 is placed within the housing 2. Thus, the corresponding elastic plates 60 urge against one side of the interior of the housing 2 and the elasticity allows the clipping of the capacitor element 4 at the center of the interior of the housing 2. Finally, the housing 2 is then filled with the securing rubber 5 so as to enclose the capacitor element 4.

Referring to 5, in the course of fixing the capacitor onto the circuit board 1, the solder 62 portion at the bottom section of the connection pins 61 of the two copper plates 60 of the capacitor is pressed against the circuit 12 of the circuit board 1 and then hot air is used to blow over the solder 62 and the contact point of the circuit 12. The solder 62 will melt and the connection pins 61 at the lower section of the copper plates 6 will be directly mounted onto the circuit 12 of the circuit board 1. Thus, the capacitor is fixed onto the circuit board 1.

Figure 6:
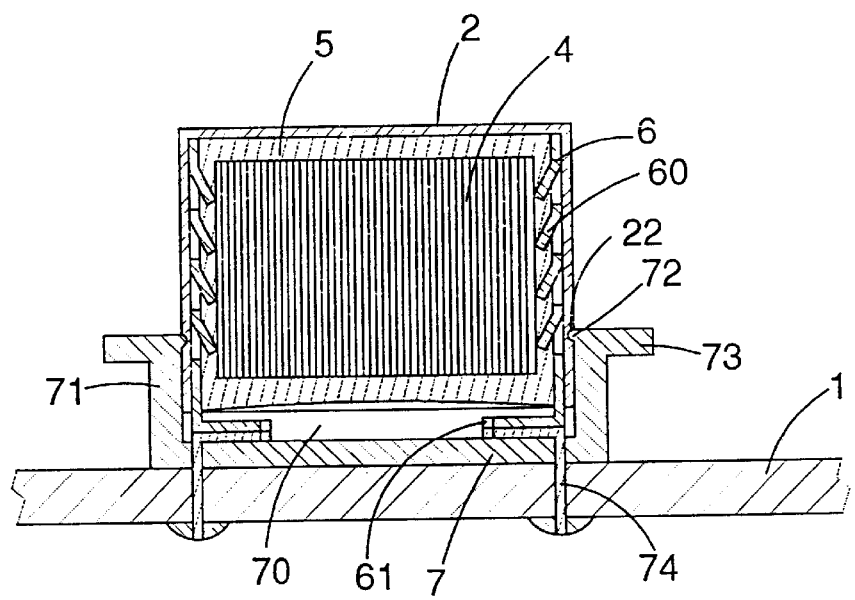
FIG. 6 is a sectional view showing the insertably mounting of the present capacitor onto a circuit board of the present invention.

Referring to FIG. 6, an insertion seat 7 is provided on the circuit board 1 and the capacitor of the present invention can be mounted thereto such that the capacitor can be easily replaced. The two lateral sides of the housing 2 are respectively provided with an engaging slot 22 for the securing of the insertion seat 7. The insertion seat 7 is provided with an upward insertion slot 70 for the insertion of the capacitor. The two lateral sides of the insertion slot 70 are provided with an elastic plate 71 having an upper end being a protruded block for the engagement with the engaging slot 22 of the capacitor. The external edge of the capacitor is provided with a push block 73 allowing the pressing of fingers to withdraw the capacitor. The bottom of the insertion slot 70 is provided with two lead legs 74 corresponding to the connection pins 61 of the capacitor. The lead legs 7 are soldered to the circuit board 1.

Figure 7:
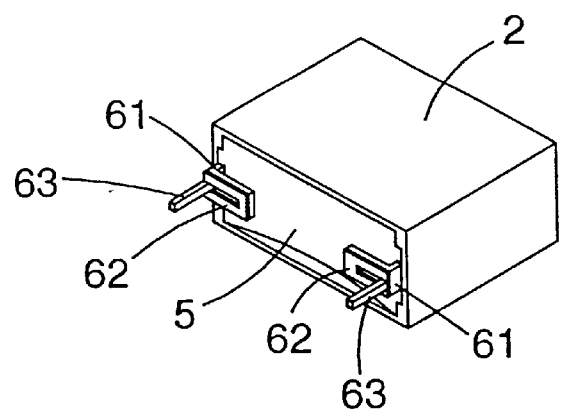
FIG. 7 is a perspective view of the capacitor of the present invention, wherein the pins of the capacitor are protruded outward.
Figure 8:
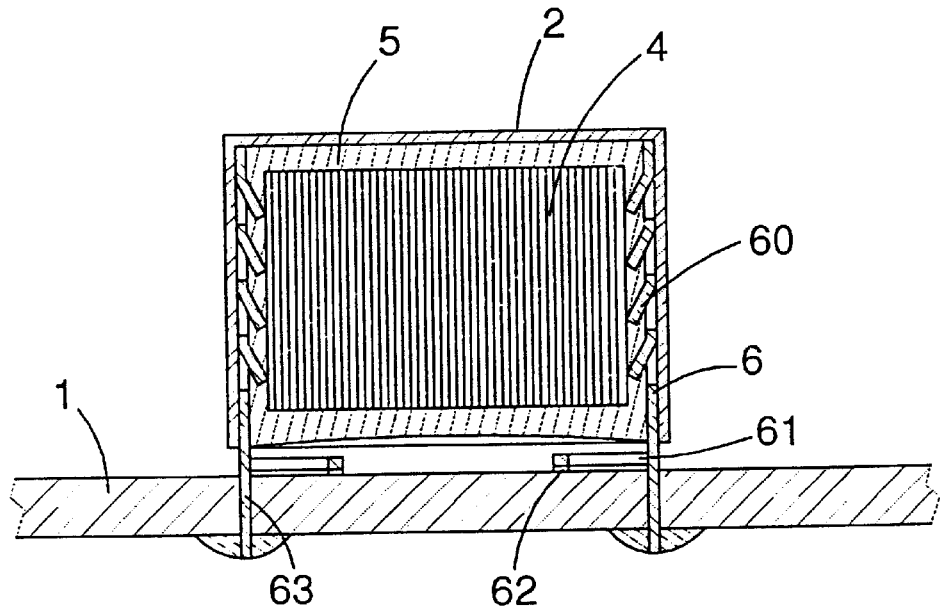
FIG. 8 is a sectional view showing the mounting of the capacitor on the circuit board in accordance with the present invention.

Referring to FIGS. 7 and 8, the insertion legs 66 of the two connection pins 61 are extended outward in an upright position allowing vertical insertion onto a conventional circuit board 1.

Figure 9A:
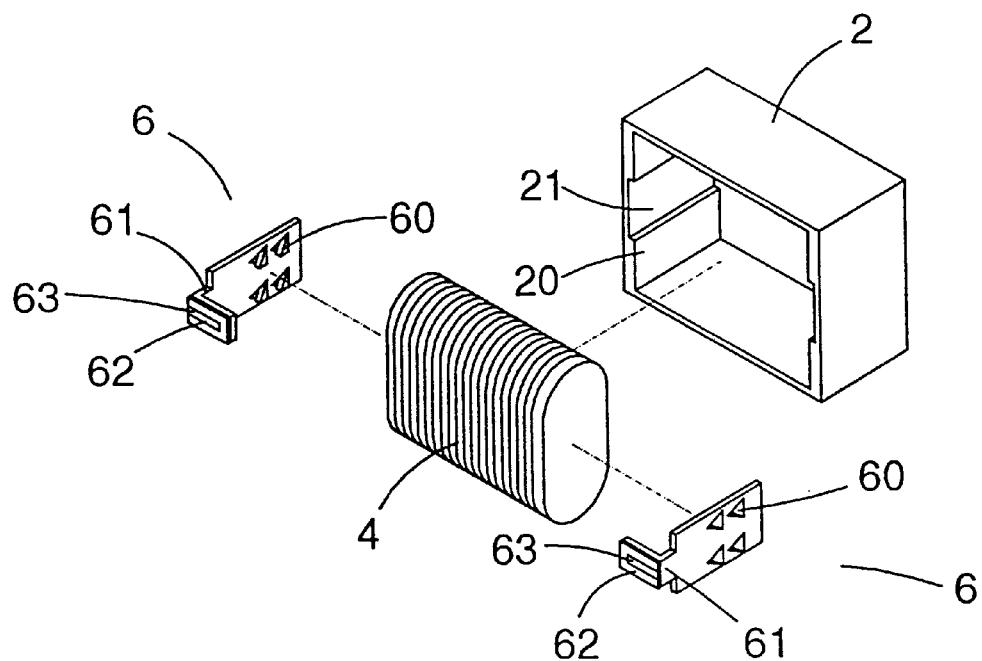
FIG. 9A is an exploded perspective view of another preferred embodiment of the present invention.
Figure 9B:
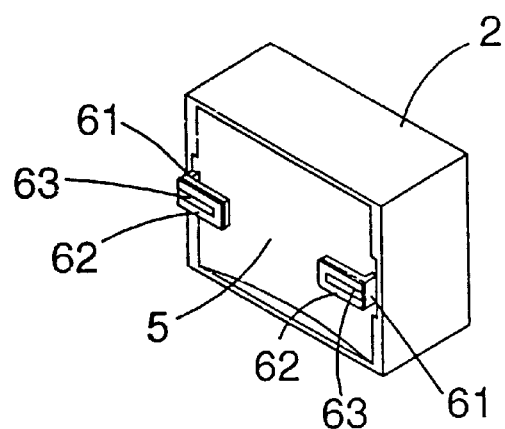
FIG. 9B is a perspective view of another preferred embodiment of the present invention.

Referring to FIG. 9, the opening of the housing 2 is located at the larger lateral side of the housing 2 such that the wider side of the capacitor element 4 faces the opening such that the height of the capacitor is greatly reduced.

In accordance with the present invention, the advantages are as follows:

1) The manufacturing process is simple and defect products are minimized. The elastic plates 60 will automatically clip the capacitor element 4 at the center of the interior of the housing 2, and thus no soldering process is required and therefore, the capacitor element 4 will not be affected by temperature, and the defect products are reduced.

2) Consistent Quality and safe in use. The elastic plates 60 of the two copper plates 6 press and mount the capacitor element 4, thus, the contact between the capacitor element 4 and the elastic plates 60 is very stable, and poor contact will not be occurred.

3) Rapid installation on the circuit board. The solder 62 at the bottom of the connection pins 61 is pressed against the circuit 12 of the circuit board 1 and a hot air is blown across the solder 62 without the cutting and trimming of the pins of the capacitor. Therefore, the connection of the capacitor with the circuit board is rapid.

4) Save space. As the height of the present capacitor is only slightly higher than the housing 2, therefore, the entire capacitor will not occupy too much space of the circuit board. As a result, the neighbouring electronic parts or circuit board is not affected.

5) No soldering hole is required. As the prefabricated solder 65 is used to mount onto the circuit 12, therefore, no soldering hole is required.

6) The capacitor can be mounted onto conventional circuit board. As fine and outward extended upright insertion pins 66 are provided on the connection pins 61, therefore, the capacitor of the present invention can be mounted onto conventional circuit board 1.

While the invention has been described with respect to preferred embodiment, it will be clear to those skilled in the art that modifications and improvements may be made to the invention without departing from the spirit and scope of the invention. Therefore, the invention is not to be limited by the specific illustrative embodiment, but only by the scope of the appended claims.

We claim:

1. An improved structure of a capacitor having a housing comprising two copper plates mounted at two lateral sides of the housing having a capacitor element in between, and a securing rubber filled within the remaining space of the housing, characterized in that a plurality of downwardly slanting elastic plates mounted at the corresponding plate of the two copper plates for the engagement with the capacitor element, the lower section of the copper plates is inwardly bent to connect with a 90 degree connection pins, the top of the connection pin are provided with solder for soldering onto a circuit board, the connection pins are punched to form a fine insertion pin for optionally mounting onto any circuit board, thereby the elastic plates clip the capacitor element to provide and/or secure soldering and contact.

2. The improved structure of a capacitor as set forth in claim 1, wherein an insertion seat is soldered onto a circuit board to provide easy replacement of capacitor.

3. The improved structure of a capacitor as set forth in claim 2, wherein the two lateral sides of the housing are respectively mounted with an engaging slot for the position of the insertion seat, and the insertion seat has an upward opened insertion slot for the insertion of the capacitor the two lateral sides of the insertion slot are respectively provided with an elastic plate, and the top end of the elastic plate is mounted with an engaging block for the engagement with the engaging slot of the capacitor, and the external lateral side is provided with a push block allowing pressing of fingers so as to withdraw the capacitor, and the bottom section of the insertion slot is mounted with a lead leg corresponding to the connection pins of the capacitor, and the lead leg is soldered at the circuit board.

4. The improved structure of a capacitor as set forth in claim 1, wherein the opening of the housing is located at the larger side of the housing, allowing the wider side of the capacitor element to be inserted into the housing so as to reduce the entire height of the capacitor.

5. The improved structure of a capacitor as set forth in claim 1, wherein the elastic plate of the copper plates are plate bodies punched inwardly from the external side of a copper plate.

* * * * *